(12) United States Patent
Kang et al.

(10) Patent No.: US 8,815,745 B2
(45) Date of Patent: Aug. 26, 2014

(54) REDUCING DAMAGE TO LOW-K MATERIALS DURING PHOTORESIST STRIPPING

(75) Inventors: Sean S. Kang, San Ramon, CA (US); Sang Jun Cho, San Ramon, CA (US); Thomas S. Choi, Sunnyvale, CA (US)

(73) Assignee: Lam Research Corporation, Fremont, CA (US)

( * ) Notice: Subject to any disclaimer, the term of this patent is extended or adjusted under 35 U.S.C. 154(b) by 559 days.

(21) Appl. No.: 12/360,765

(22) Filed: Jan. 27, 2009

(65) Prior Publication Data

US 2009/0197422 A1 Aug. 6, 2009

Related U.S. Application Data

(60) Provisional application No. 61/025,590, filed on Feb. 1, 2008.

(51) Int. Cl.
*H01L 21/302* (2006.01)

(52) U.S. Cl.
USPC ............. 438/710; 438/700; 438/717; 216/41; 216/67

(58) Field of Classification Search
USPC ......... 438/636, 700, 725, 717, 738, 640, 624, 438/597, 714; 216/67; 118/715
See application file for complete search history.

(56) References Cited

U.S. PATENT DOCUMENTS

| | | | | |
|---|---|---|---|---|
| 5,702,562 A | * | 12/1997 | Wakahara | 216/60 |
| 6,080,680 A | * | 6/2000 | Lee et al. | 438/727 |
| 6,187,688 B1 | * | 2/2001 | Ohkuni et al. | 438/725 |
| 6,607,986 B2 | * | 8/2003 | Seta et al. | 438/710 |
| 2004/0084412 A1 | | 5/2004 | Waldfried et al. | |
| 2006/0024968 A1 | | 2/2006 | Hudson et al. | |
| 2006/0183314 A1 | * | 8/2006 | Dellaguardia et al. | 438/618 |
| 2006/0226120 A1 | * | 10/2006 | Rusu et al. | 216/67 |
| 2007/0059933 A1 | | 3/2007 | Tahara et al. | |
| 2007/0218679 A1 | | 9/2007 | Schneider et al. | |

OTHER PUBLICATIONS

James D. Plummer, Michael D. Deal, Peter B. Griffin; Silicon VLSI Technology, Jul. 24, 2000, Tom Robbins p. 638-639.*
Tsai et al. Conversion of Carbonyl Sulfide Using a Low-Temperature Discharge Approach, Aerosol and Air Quality Research, Jun. 2007, vol. 7, No. 2, pp. 251-259.*
Search Report dated Jul. 28, 2009 from International Application No. PCT/US2009/032162.
Written Opinion dated Jul. 28, 2009 from International Application No. PCT/US2009/032162.

* cited by examiner

*Primary Examiner* — Duy Deo
*Assistant Examiner* — Erin Bergner
(74) *Attorney, Agent, or Firm* — Beyer Law Group LLP

(57) ABSTRACT

A method of forming features in a porous low-k dielectric layer disposed below a patterned organic mask is provided. Features are etched into the porous low-k dielectric layer through the patterned organic mask, and then the patterned organic mask is stripped. The stripping of the patterned organic mask includes providing a stripping gas comprising COS, forming a plasma from the stripping gas, and stopping the stripping gas. A cap layer may be provided between the porous low-k dielectric layer and the patterned organic mask. The stripping of the patterned organic mask leaves the cap layer on the porous low-k dielectric layer.

20 Claims, 12 Drawing Sheets

REDUCING DAMAGE TO LOW-K MATERIALS DURING PHOTORESIST STRIPPING

CROSS REFERENCE TO RELATED APPLICATION

The present application claims benefit of priority to U.S. Provisional Application No. 61/025,590, filed Feb. 1, 2008, which is incorporated herein by reference.

BACKGROUND OF THE INVENTION

The present invention relates to the fabrication of semiconductor-based devices. More particularly, the present invention relates to improved techniques for fabricating semiconductor-based devices with low-k dielectric layers.

In semiconductor-based device (e.g., integrated circuits or flat panel displays) manufacturing, dual damascene structures may be used in conjunction with copper conductor material to reduce the RC delays associated with signal propagation in aluminum based materials used in previous generation technologies. In dual damascene, instead of etching the conductor material, vias and trenches may be etched into the dielectric material and filled with copper (referred to as "metallization"). The excess copper may be removed by chemical mechanical polishing (CMP) leaving copper lines connected by vias for signal transmission. To reduce the RC delays even further, porous low-k dielectric constant materials may be used. In the specification and claims low-k is defined as $k<3.0$.

Porous low dielectric constant materials may include organo-silicate glass (OSG) materials, which are also called carbon-doped silicates. OSG materials may be silicon dioxide doped with organic components such as methyl groups. OSG materials have carbon and hydrogen atoms incorporated into a silicon dioxide lattice, which lowers the dielectric constant of the material. However, OSG materials may be susceptible to damage when exposed to $O_2$, $H_2$, $N_2$, and $NH_3$ gases, which are used for stripping photoresist material or fluorine within a stripping plasma. It is believed that such damage may be caused by the removal of carbon from the low-k dielectric, which increases the dielectric constant and makes the material more hydrophilic so that it retains moisture. The retention of moisture creates metal barrier adhesion problems or may cause other barrier problems.

The damaging effects of stripping plasmas can penetrate deeper into porous material, compared to non-porous (dense) materials. Porous OSG materials (with $k<\sim2.5$) may be very susceptible to damage due to the removal of organic content by exposure to the plasma used to strip the mask and/or sidewalls. For example, photoresist (PR) ashing or stripping process is one of the process steps that cause the most significant damage to such porous low-k dielectric layer, in which the PR material is stripped off under plasma systems. The plasma may diffuse into the pores of the porous OSG layer and cause damage as far as 300 nm into the OSG layer. Part of the damage caused by the plasma is the removal of carbon and hydrogen from the damaged area causing the OSG to be more like silicon dioxide, which has a higher dielectric constant. Damage may be quantified by measuring the change in SiC/SiO ratio of the OSG layer from FTIR analysis. For the typical trench etch application, the modification of OSG more than 3-5 nm into the trench sidewall is unacceptable.

It is desirable to reduce damage to low-k ($k<3.0$) dielectric layers during the stripping process.

SUMMARY OF THE INVENTION

To achieve the foregoing and other objectives and in accordance with the purpose of the present invention a method of forming features in a porous low-k dielectric layer disposed below a patterned organic mask is provided. Features are etched into the porous low-k dielectric layer through the patterned organic mask, and then the patterned organic mask is stripped. The stripping of the patterned organic mask includes providing a stripping gas comprising COS, forming a plasma from the stripping gas, and stopping the stripping gas. In an aspect of the invention, a cap layer is provided between the porous low-k dielectric layer and the patterned organic mask. The stripping of the patterned organic mask leaves the cap layer on the porous low-k dielectric layer.

In another manifestation of the invention, an apparatus for forming features in a porous low-k dielectric layer disposed below a patterned organic mask is provided. The apparatus comprises a plasma processing chamber. The plasma processing chamber includes a chamber wall forming a plasma processing chamber enclosure, a substrate support for supporting a substrate within the plasma processing chamber enclosure, a pressure regulator for regulating the pressure in the plasma processing chamber enclosure, at least one electrode for providing power to the plasma processing chamber enclosure for sustaining a plasma, at least one RF power source electrically connected to the at least one electrode, a gas inlet for providing gas into the plasma processing chamber enclosure, and a gas outlet for exhausting gas from the plasma processing chamber enclosure. The apparatus further comprises a gas source in fluid connection with the gas inlet. The gas source includes a porous low-k dielectric etch gas source, and a stripping gas source which includes a COS source and at least one another gas source. A controller is controllably connected to the gas source and the at least one RF power source. The controller includes at least one processor, and computer readable media. The computer readable media includes (a) computer readable code for etching features into the porous low-k dielectric layer through the patterned organic mask, and (b) computer readable code for stripping the patterned organic mask. The computer readable code for stripping the patterned organic mask includes computer readable code for providing a stripping gas comprising COS, computer readable code for forming a plasma from the stripping gas, and computer readable code for stopping the stripping gas.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Without being bound by theory, it is believed that most of the damage to the low-k dielectric layer occurs during stripping, because stripping removes an organic resist material, and this process tends to also remove carbon from the low-k dielectric material. In addition, it is believed that damage is more noticeable as a result of a trench strip than a via strip, since trenches are more closely spaced and having more capacitance between each other. It is also believed that such damage is a greater problem with small features than large features. It is also believed that such damage is more of a problem on the sidewall of a trench than the bottom of a trench.

Figure 1A:
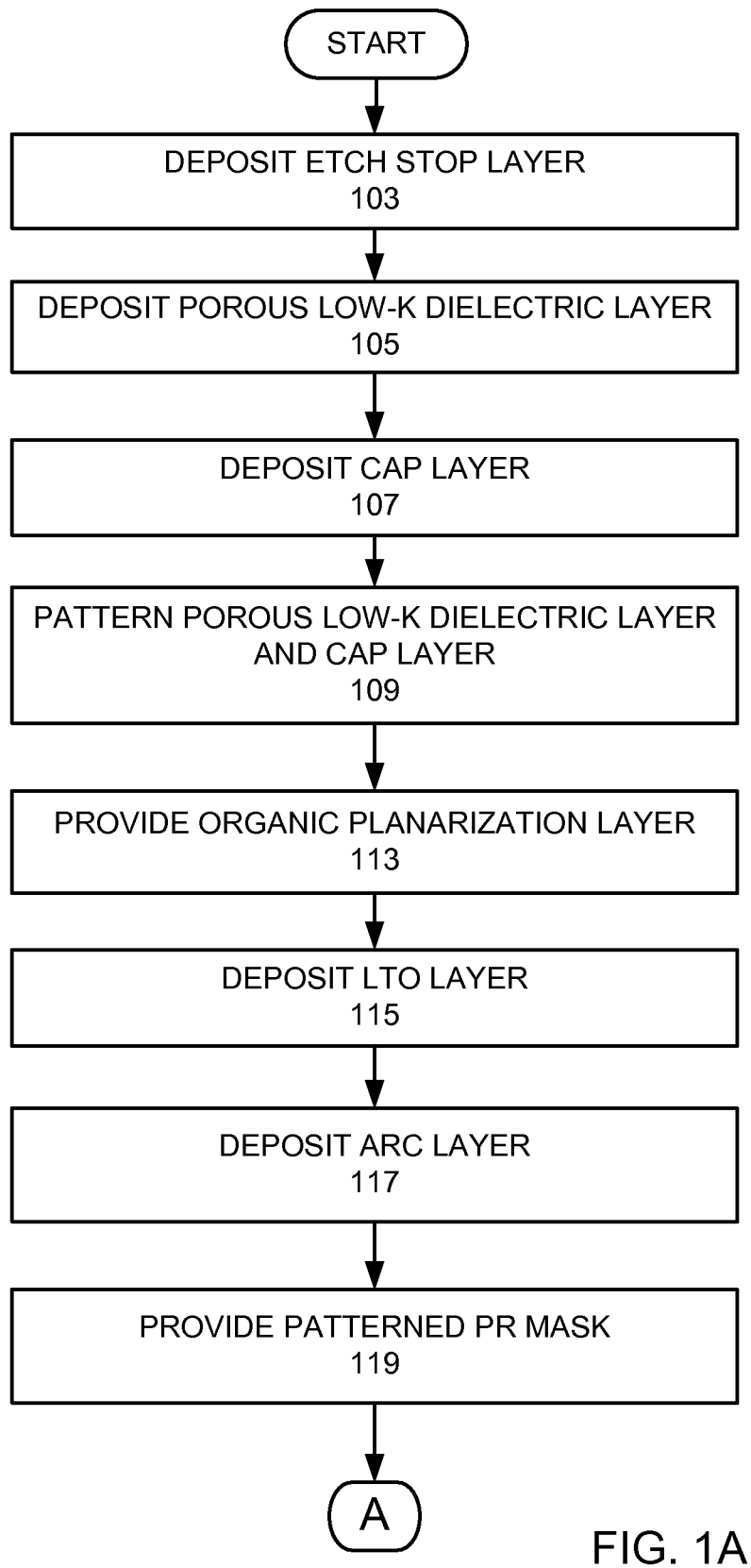
FIGS. 1A-1B are a flow chart of an etching process of a stack of layers including a porous low-k dielectric layer in accordance with one embodiment of the present invention.
Figure 1B:
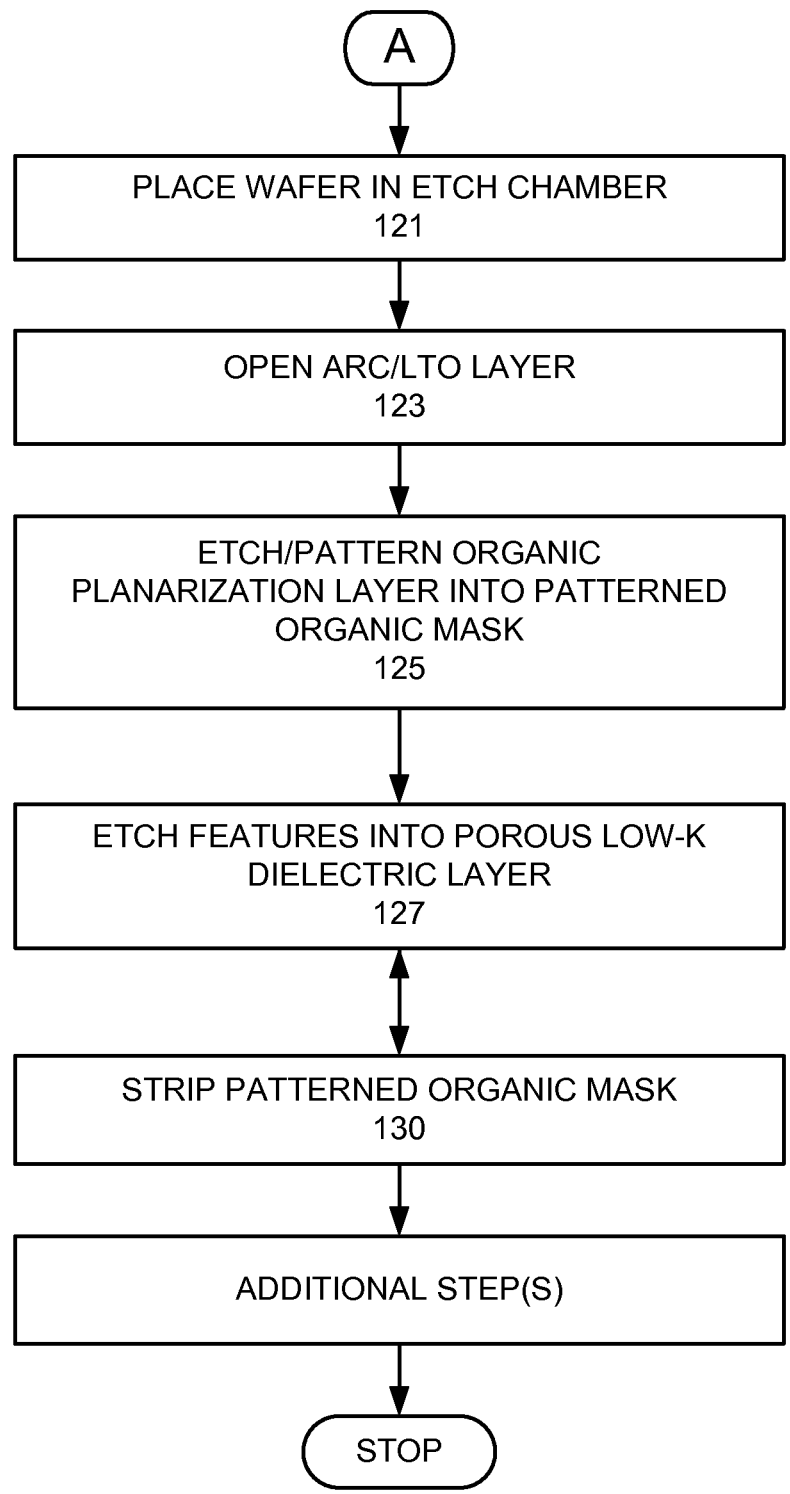
Figure 2A:
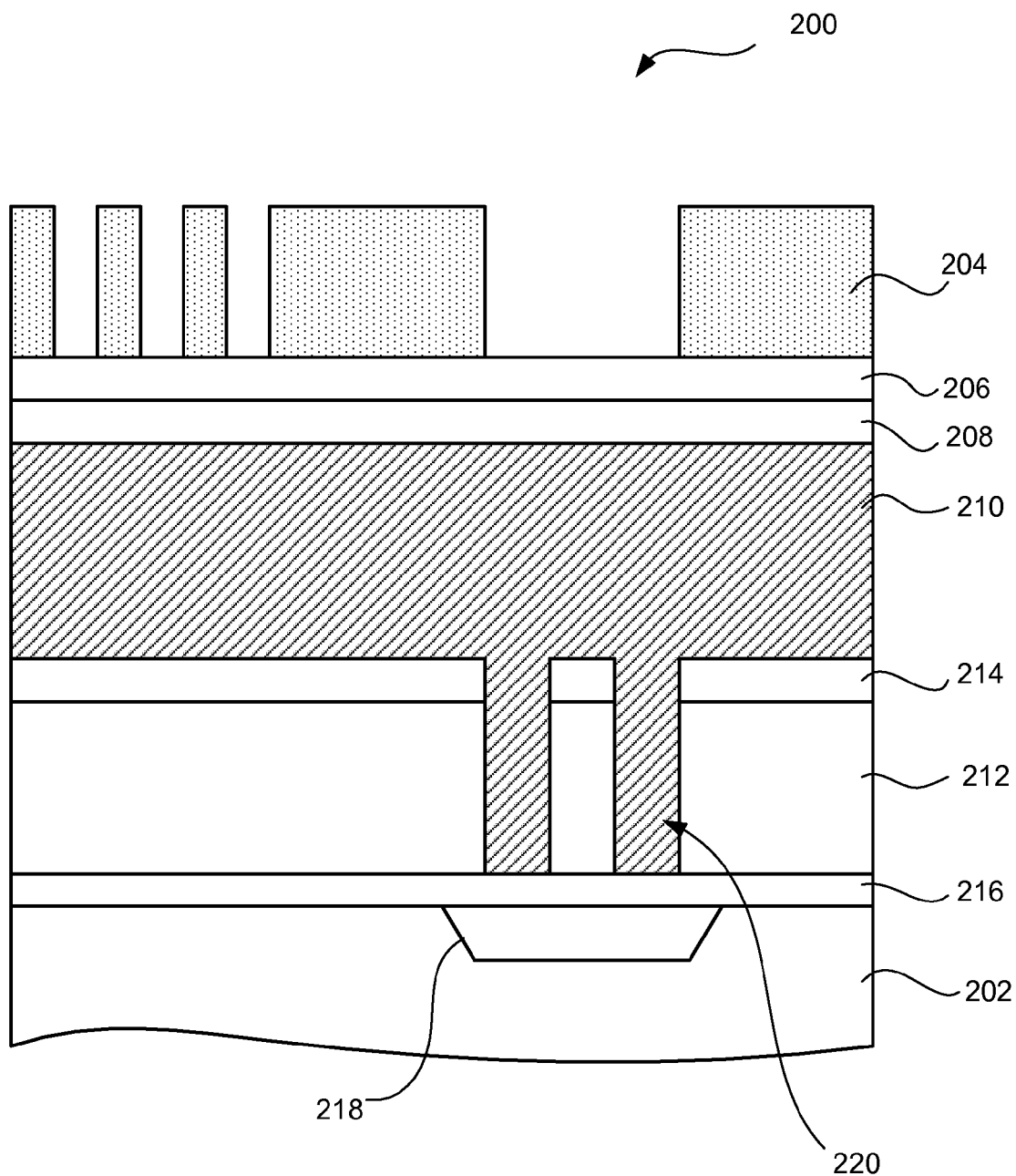
FIGS. 2A-2F are schematic cross-sectional views of the stack of layers including the porous low-K dielectric layer according to the process of FIGS. 1A-1B.

To facilitate discussion, FIGS. 1A-1B are a flow chart of an etching process of a stack of layers including a porous low-k dielectric layer used in an embodiment of the invention. Preferably, the porous low-k dielectric layer is an organo-silicate glass (OSG) material. FIGS. 2A-2F are schematic cross-sectional views of the stack of layers according to the process of FIGS. 1A-1B. FIG. 2A is a schematic cross-sectional view of an example of a stack 200 of layers formed on a semiconductor substrate 202 in accordance with one embodiment of the present invention. As shown in FIG. 2A, the stack 200 includes a patterned photoresist (PR) mask 204 formed on an antireflective coating (ARC) layer 206, over an oxide layer such as low temperature oxide (LTO) layer 208, over an organic planarization layer 210. The organic planarization layer 210 is formed over a patterned porous low-k dielectric layer 212. The patterned porous low-k dielectric layer 212 may have a cap layer 214 provided thereon. The porous low-k dielectric layer 212 is formed over an etch stop layer 216 on the substrate 202. The substrate 202 may have a metal layer 218 such as a metal contact layer or metal trench layer.

The stack 200 may be formed by the following process steps in accordance with one embodiment of the present invention. As shown in FIG. 1A, the etch stop layer 216 such as silicon carbon nitride (SiCN) is formed over the semiconductor substrate 202 (step 103). The etch stop layer 216 may have a thickness of about 25 nm. The substrate 202 may be a silicon wafer or another type of material or may be part of a layer over a wafer. The substrate may have the underlying metal layer 218 which may be part of a dual damascene interconnect structure. The porous low-k dielectric layer 212 is disposed over the etch stop layer 216 (step 105). The porous low-k dielectric layer 212 may be made of an OSG material, and have a thickness of about 270 nm. The optional cap layer 214 is deposited over the porous low-k dielectric layer 212 (step 107). Generally, the cap layer is a protective layer of the underlying dielectric material layer. The cap layer 214 protects the porous low-k dielectric layer 212 during chemical mechanical polishing (CMP) and other processes. The cap layer 214 may be a low-k dielectric, since the cap layer may be part of the end product. Preferably, the cap layer is formed of TEOS (tetraethylorthosylicide), a silicon oxide or silicon carbide base material. The cap layer 214 may have a thickness of about 60 nm. In other embodiments, there may be more than one cap layers or no cap layer.

The porous low-k dielectric layer 212 and the cap layer 214 is patterned together so as to have first features 220 such as vias using a first PR mask (not shown) provided by conventional photolithography processes (step 109). For example, the first PR mask may be formed by placing a layer of photoresist, which is exposed to a light pattern and then etched. After etching the first features 220 into the porous low-k dielectric layer 212 and the remaining first PR mask is stripped, the organic planarization layer 210 is deposited over the patterned cap layer 214 over the patterned porous low-k dielectric layer 212 so as to fill the first features 220 and form a planar surface (step 113). The organic planarization layer 210 is made of a photoresist like material, such as NFC, available from JSR Micro, Inc., Sunnyvale, Calif. In addition, other material such as SOC (Spin-On Carbon), SOH (Spin-On Hardmask) available from Shipley Co. Inc., Marlborough, Mass., TOK, Japan, JSR Micro, Inc., and the like may be used. The organic planarization layer 210 may have a thickness about 300 nm. The LTO layer 208 is deposited on the organic planarization layer 210 (step 115), for example, by LPCVC process with the deposition temperature about 100° C. which is lower than the typical deposition temperature of 800° C. or higher in the conventional $SiO_2$ deposition process. The LTO layer 208 may have a thickness of about 80 nm. The LTO layer 208 may act as a hardmask for the underlying organic planarization layer 210. The ARC layer 206 is deposited over the LTO layer 208 (step 117), for example, using PECVD process. The ARC layer 206 may be a bottom anti-reflective coating (BARC) layer formed of $SiO_xN_y$ (e.g., SiON) having a thickness about 80 nm. A photoresist layer is formed on the ARC layer 206 and patterned into a second PR mask 204 using conventional photolithography processes (step 119), for example, by placing a layer of photoresist, which is exposed to a light pattern and then etched. Other methods of forming a patterned photoresist mask may be used. The second PR mask 204 may have a thickness of about 170 nm, and has second mask features to etch/pattern the organic planarization layer 210. FIG. 2A shows the stack 200 after the patterned second PR mask 204 is provided.

Figure 2B:
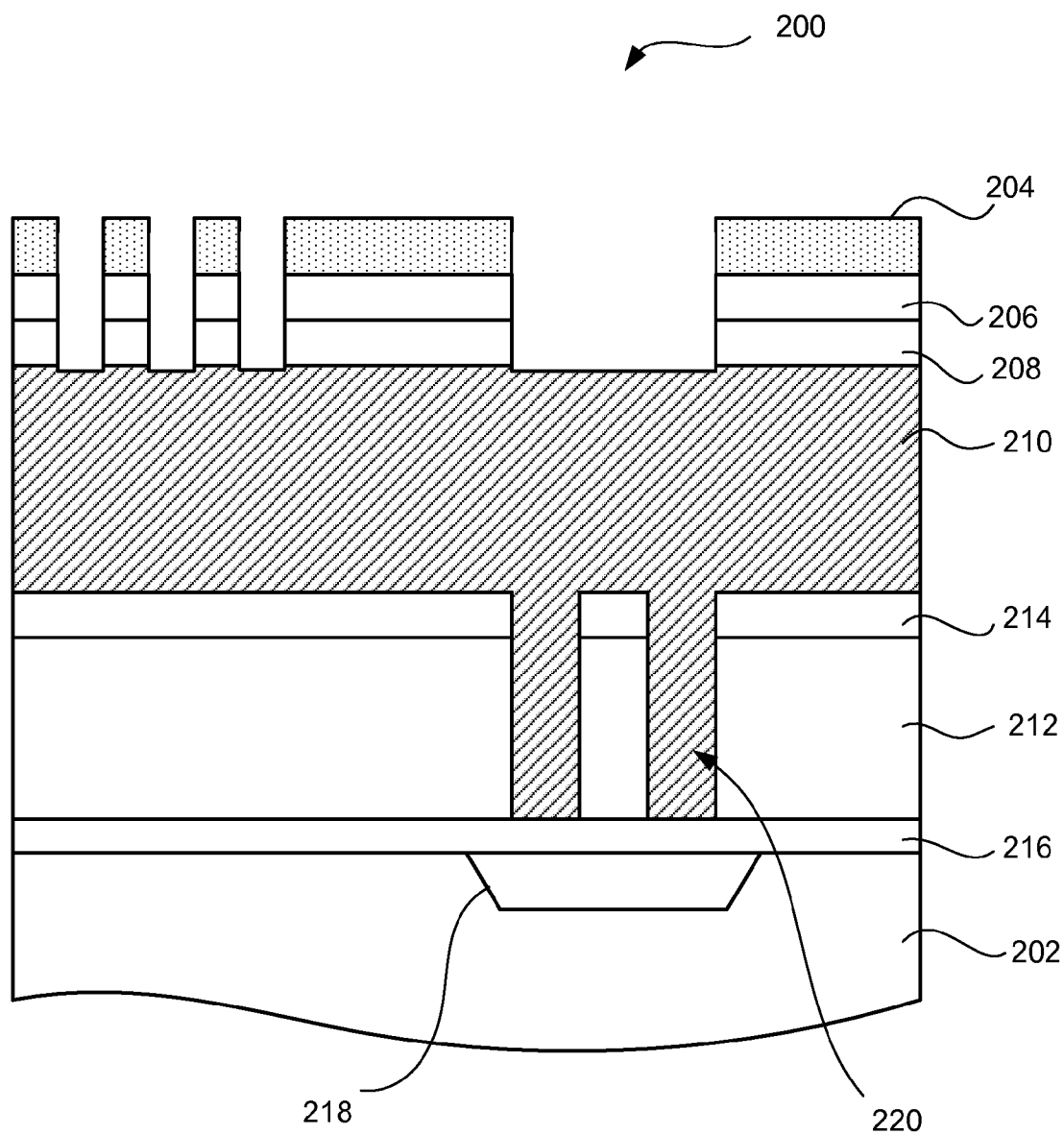

As shown in FIG. 1B, the substrate 202 with the stack 200 is placed in an etching chamber for dielectric etch (step 121). The ARC layer 206 and the LTO layer 208 are first opened though the second PR mask 204 (step 123). A plasma dry etch may be used to open the ARC layer 206 and the LTO layer 208, using a chemistry including $CF_4$ and $O_2$, for example. FIG. 2B is a schematic cross-sectional view of an example of the stack 200 after ARC/LTO open. As shown in FIG. 2B, some of the second PR mask 204 may be removed during the ARC/LTO opening.

Figure 2C:
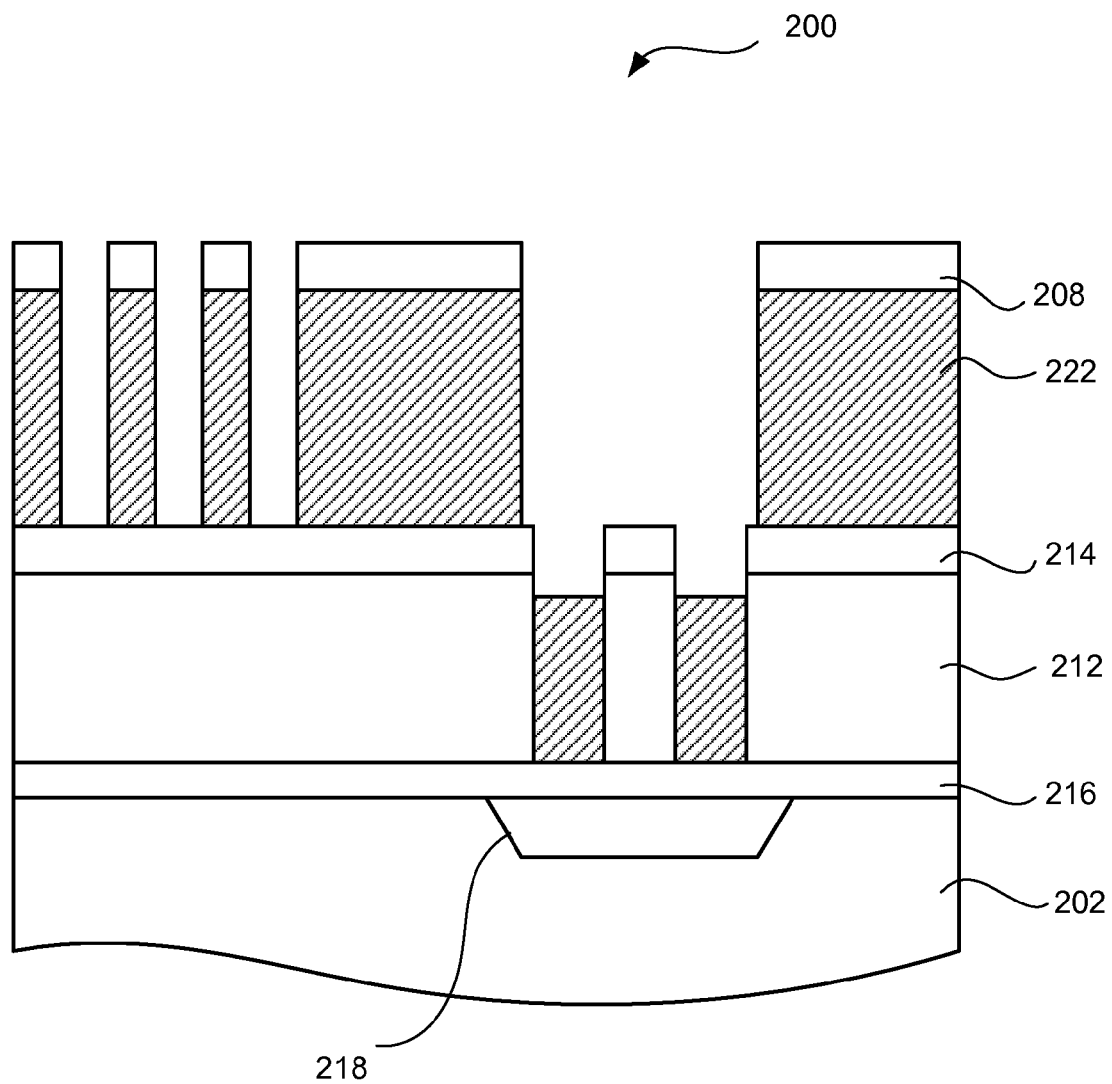

Then, the organic planarization layer 210 is etched/patterned using the second PR mask 204 through the openings of the ARC layer 206 and the LTO layer 208 (step 125). A $CO_2$ based chemistry may be used for this etching/patterning of the organic planarization layer 210. FIG. 2C schematically illustrates a cross-sectional view of the stack 200 after the planarization layer etch. As shown in FIG. 2C, the organic planarization layer 210 is patterned into an organic resist mask 222 for the subsequent low-k dielectric etch. The second PR mask 204 and the ARC layer 206 are removed during the etching/patterning step 125, but the LTO (hardmask) 208 may remain on the top of the patterned organic mask 222. The cap layer 214 protects the underlying porous low-k dielectric layer 212 during the etch/patterning step 125, and may also act as an etch stop layer.

Figure 2D:
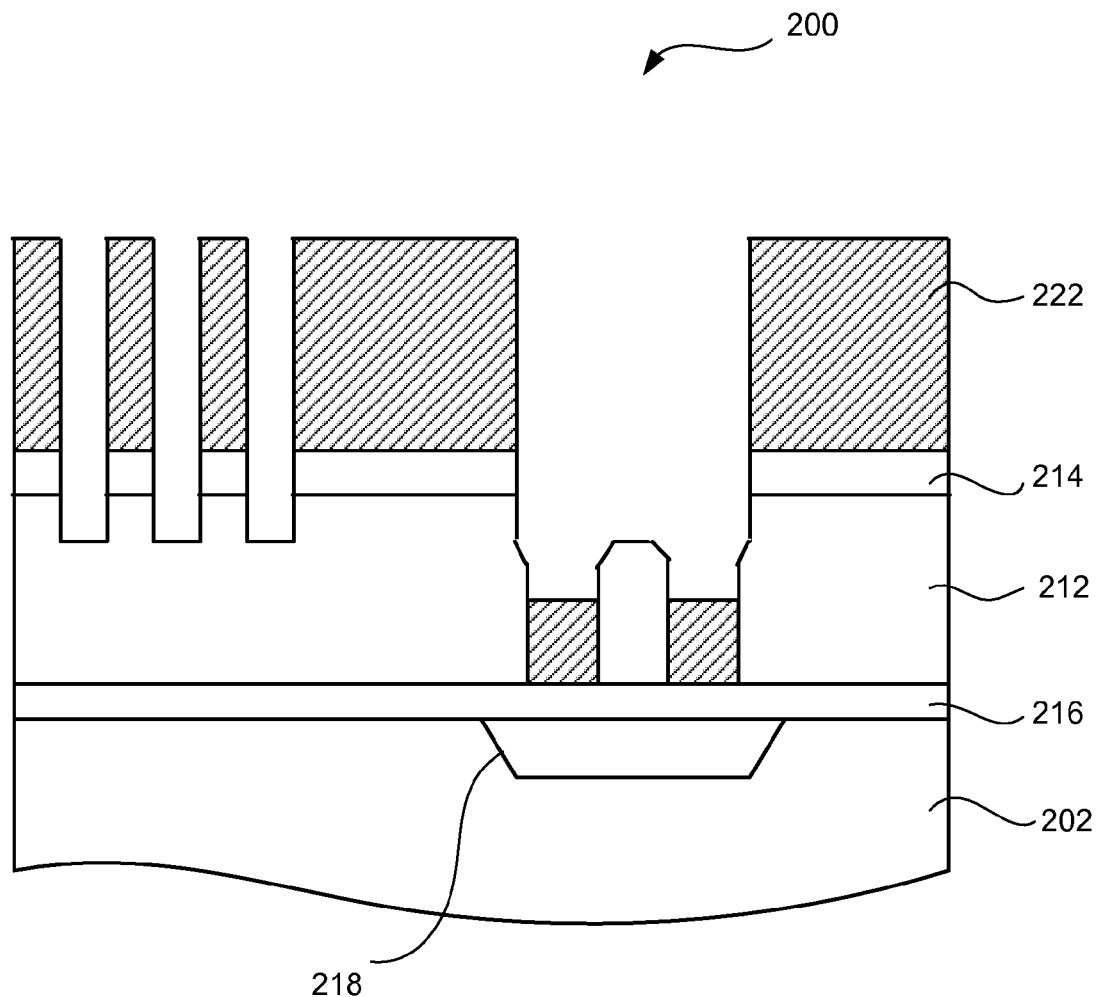

Then, second features are etched into the porous low-k dielectric layer 212 through the opened LTO (hardmask) 208 and the patterned organic mask 222 (step 127). Such low-k dielectric etch processes may use a fluorine based etchant. For example, the etch process may use $CF_4$, or mixtures of source gases: $CF_4/N_2$ or $C_4F_8/N_2$. FIG. 2D schematically illustrates a cross-sectional view of the stack 200 after the porous low-k dielectric etch step 127. As shown in FIG. 2D, the LTO layer 208 is removed by the porous low-k dielectric etch step 127.

Figure 2E:
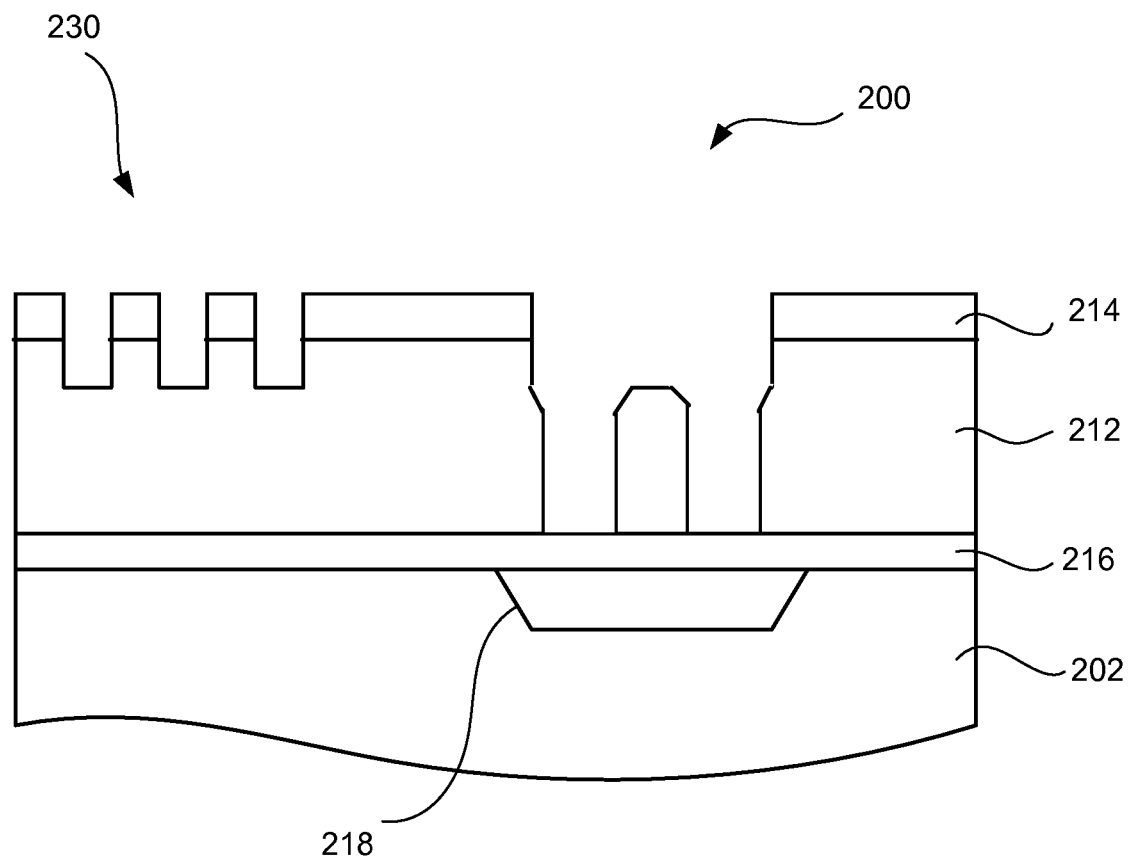
Figure 3:
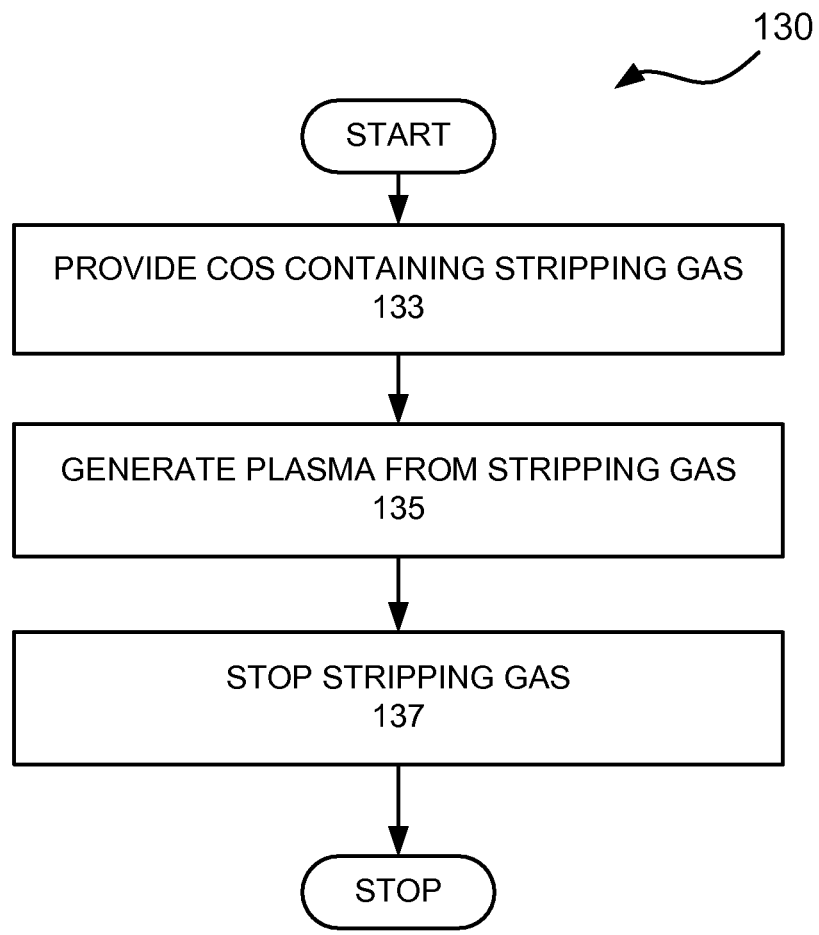
FIG. 3 is a detailed flow chart of the stripping process in accordance with one embodiment of the present invention.

After the etching of the porous low-k dielectric layer 212 is completed, the patterned organic mask 222 is stripped (step 130). FIG. 3 is a detailed flow chart of the stripping process 130. In the stripping process 130, a stripping gas comprising COS is provided into the etch chamber (step 133). A plasma is formed from the stripping gas containing COS (step 135), where the plasma is used to strip the patterned organic mask 222, and the stripping gas is stopped (step 137). In accordance with one embodiment of the present invention, the stripping gas contains: COS, $O_2$, and CO; COS and $O_2$; or COS and $N_2$. FIG. 2E schematically illustrates a cross-sectional view of the stack 200 after the patterned organic mask 222 is stripped. As shown in FIG. 2E, the cap layer 214 remains on the top of the porous low-k dielectric layer 212.

Figure 2F:
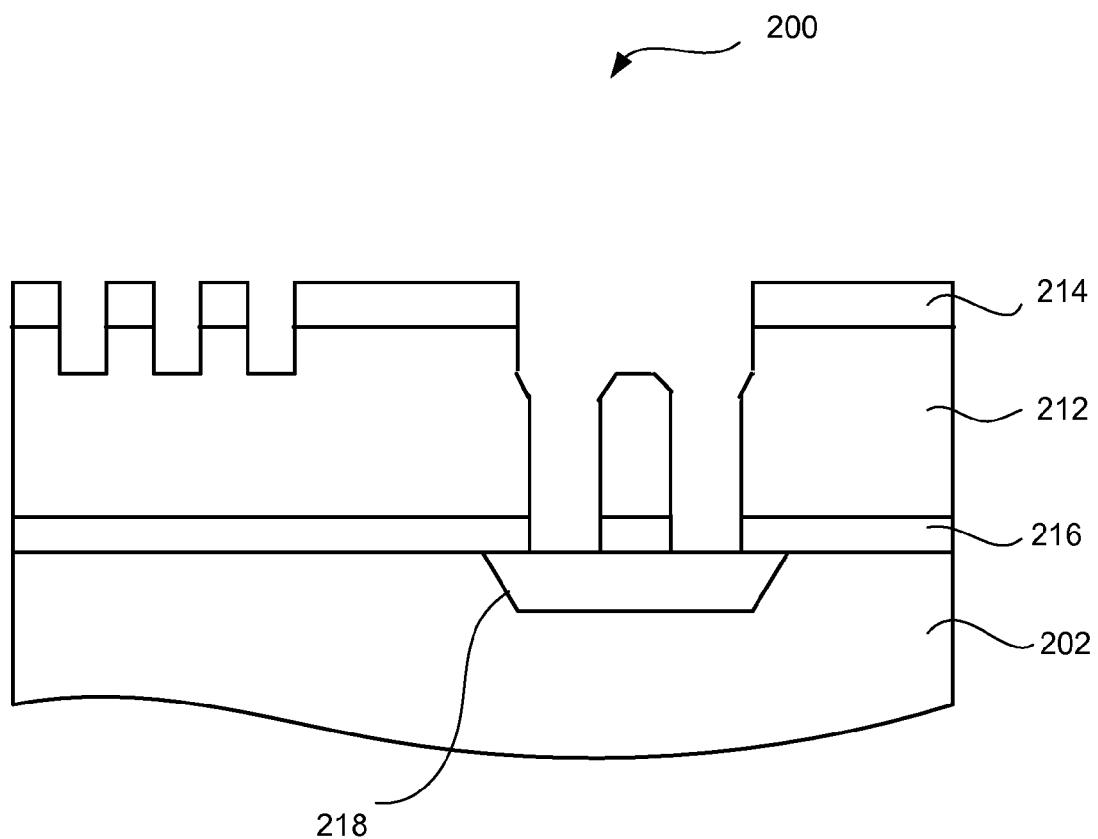

In some embodiments of the invention, the etch stop layer 216 may be opened so as to expose the metal layer 218, after the organic mask 222 is stripped, as shown in FIG. 2F.

Figure 4:
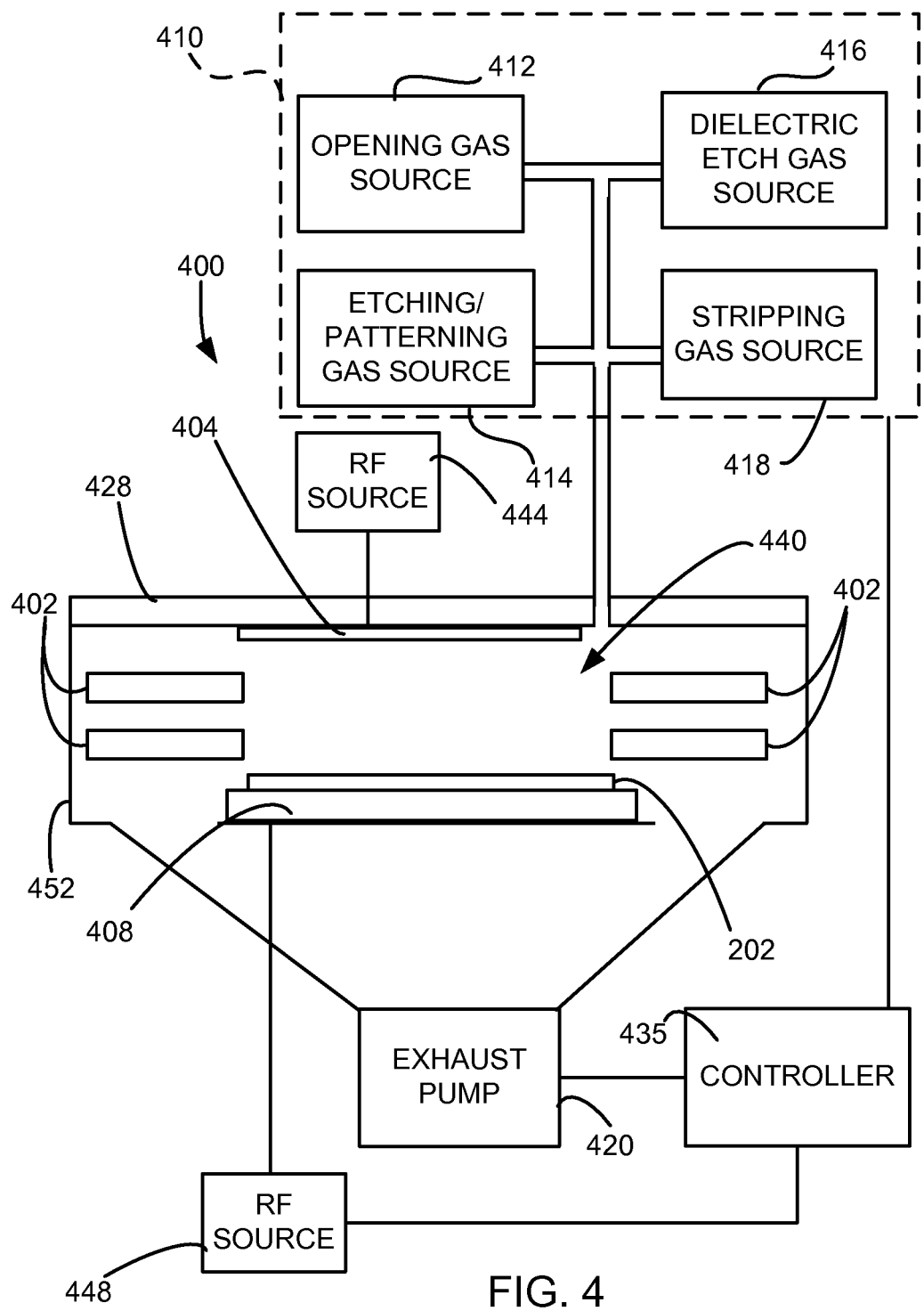
FIG. 4 is a schematic view of a process chamber that may be used in an embodiment of the invention.

FIG. 4 is a schematic view of a plasma processing chamber 400 that may be used for opening the ARC/LTO layer, etching/patterning the organic planarization layer, etching features into the porous low-k dielectric layer, and then stripping the organic mask in situ. Optionally, opening of the etch stop layer may also performed in situ. The plasma processing chamber 400 comprises confinement rings 402, an upper electrode 404, a lower electrode 408, a gas source 410, and an exhaust pump 420. The gas source 410 comprises an opening gas source 412 for opening the ARC/LTO layer, an etching/patterning gas source 414 for etching/patterning the organic planarization layer, dielectric etch gas source 416 for etching features into the porous low-k dielectric layer, and a stripping gas source 418 for stripping the organic mask. The gas source 410 may comprise additional gas sources (not shown). Within the plasma processing chamber 400, the substrate 202 is positioned upon the lower electrode 408. The lower electrode 408 incorporates a suitable substrate chucking mechanism (e.g., electrostatic, mechanical clamping, or the like) for holding the substrate 202. The reactor top 428 incorporates the upper electrode 404 disposed immediately opposite the lower electrode 408. The upper electrode 404, lower electrode 408, and confinement rings 402 define the confined plasma volume 440. Gas is supplied to the confined plasma volume by the gas source 410 and is exhausted from the confined plasma volume through the confinement rings 402 and an exhaust port by the exhaust pump 420. A first RF source 444 is electrically connected to the upper electrode 404. A second RF source 448 is electrically connected to the lower electrode 408. Chamber walls 452 surround the confinement rings 402, the upper electrode 404, and the lower electrode 408. Both the first RF source 444 and the second RF source 448 may comprise a 27 MHz power source, a 60 MHz power source, and a 2 MHz power source. Different combinations for connecting different frequencies of RF power to the upper and lower electrode are possible. A controller 435 is controllably connected to the first RF source 444, the second RF source 448, the exhaust pump 420, and the gas source 410. The controller 435 is able to control the flow rate of the various gases. In the case of Lam Research Corporation's Dielectric Etch Systems such as Exelan® Series, made by LAM Research Corporation™ of Fremont, Calif., which may be used in a preferred embodiment of the invention, the 60 MHz, 27 MHz, and 2 MHz power sources make up the second RF power source 448 connected to the lower electrode, and the upper electrode is grounded.

Figure 5A:
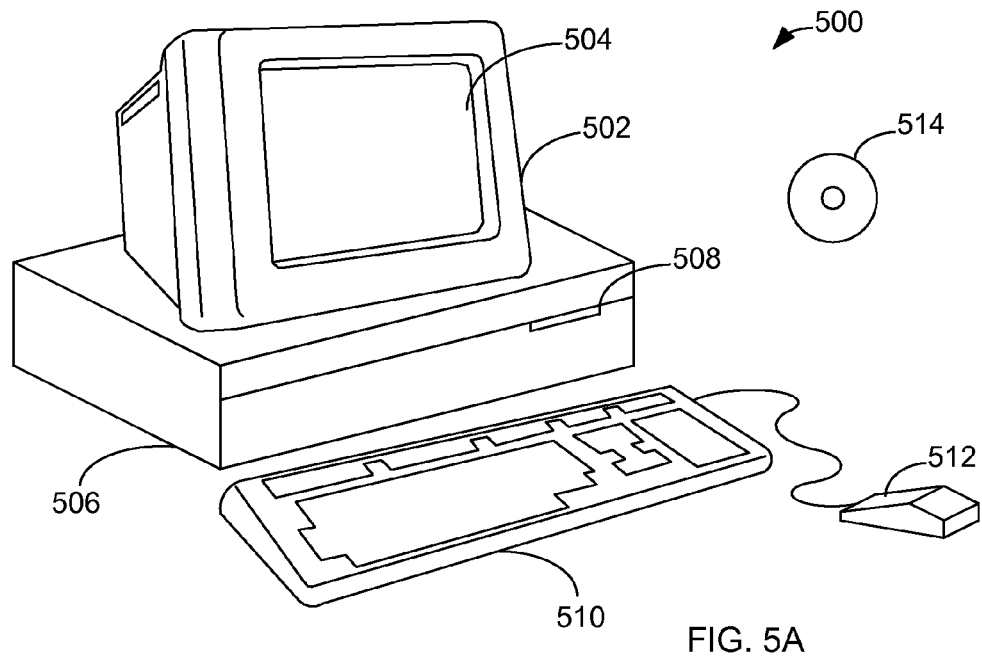
FIGS. 5A-5B are schematic views of a computer system that may be used as a controller.
Figure 5B:
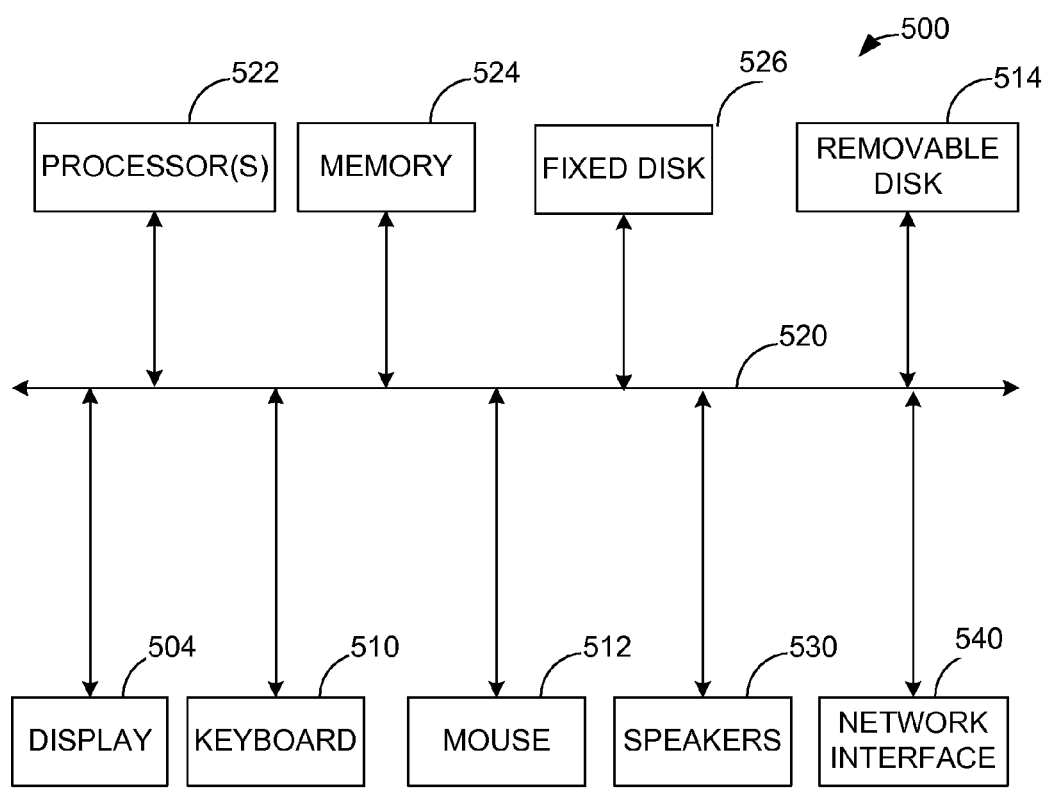

FIGS. 5A and 5B illustrate a computer system 500, which is suitable for implementing a controller 435 used in embodiments of the present invention. FIG. 5A shows one possible physical form of the computer system. Of course, the computer system may have many physical forms ranging from an integrated circuit, a printed circuit board, and a small handheld device up to a huge super computer. Computer system 500 includes a monitor 502, a display 504, a housing 506, a disk drive 508, a keyboard 510, and a mouse 512. Disk 514 is a computer-readable medium used to transfer data to and from computer system 500.

FIG. 5B is an example of a block diagram for computer system 500. Attached to system bus 520 is a wide variety of subsystems. Processor(s) 522 (also referred to as central processing units, or CPUs) are coupled to storage devices, including memory 524. Memory 524 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 526 is also coupled bi-directionally to CPU 522; it provides additional data storage capacity and may also include any of the computer-readable media described below. Fixed disk 526 may be used to store programs, data, and the like and is typically a secondary storage medium (such as a hard disk) that is slower than primary storage. It will be appreciated that the information retained within fixed disk 526 may, in appropriate cases, be incorporated in standard fashion as virtual memory in memory 524. Removable disk 514 may take the form of any of the computer-readable media described below.

CPU 522 is also coupled to a variety of input/output devices, such as display 504, keyboard 510, mouse 512 and speakers 530. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 522 optionally may be coupled to another computer or telecommunications network using network interface 540. With such a network interface, it is contemplated that the CPU might receive information from the network, or might output information to the network in the course of performing the above-described method steps. Furthermore, method embodiments of the present invention may execute solely upon CPU 522 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Without being bound by theory, it is believed that an oxidizing stripping process provides a faster and more complete stripping than a reducing stripping process. In addition, it was generally believed that oxygen radicals were the only source of OSG damage. It has been found that there is a correlation between excited $O_2$ molecules and dielectric damage. The damage is especially significant for low-k dielectric materials with k values <~2.5. Some alternative gases have been used, among which provide $CO_2$ or $N_2O$ instead of $O_2$ as a source of oxygen, shows some reduction in low-k damage. Other combinations, such as $O_2/N_2$, $CO/O_2$, or $N_2/O_2/CO$ also show some improvement over using $O_2$. However none of those gases or their combinations provide as much improvement as adding COS. It was unexpectedly found that using COS gas as an additive to a conventional PR stripping gas containing $O_2$ significantly reduces the low-k dielectric damage during the strip process. In addition, it is believed that adding COS gas to a $N_2$ and/or $H_2$ based stripping gas also reduce the low-k damage.

For example, compared with a conventional stripping gas without COS, the low-k dielectric damage is reduced about 40 to 50% when COS is added to the conventional stripping gas. It is believed that the inventive process provides a method for stripping photoresist or organic mask material in the presence of sensitive porous low-k dielectric materials, producing minimal damage to the porous low-k dielectric material.

Figure 6A:
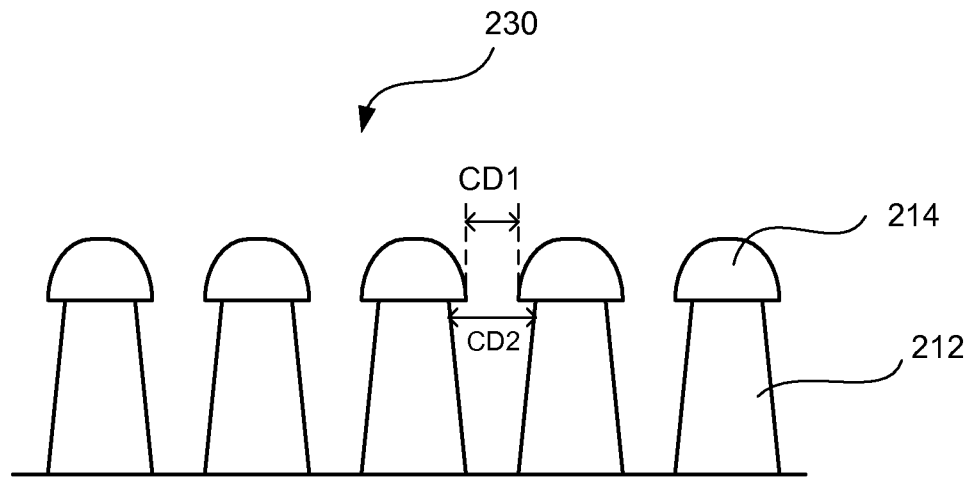
FIG. 6A is a schematic cross-sectional view of features of the porous low-k dielectric layer in a dense area after the conventional stripping process.

In accordance with one embodiment of the present invention, the etch chamber is an Exelan 2300, and the stripping process is performed after the main low-k dielectric etch. Such low-k dielectric etch may use an etching gas containing 200 sccs $CF_4$ under the pressure of 30 mTorr. 600 watts at 60 MHz and 300 watts at 2 MHz may be provided. A conventional stripping process, as a reference, may use a stripping gas of 40 sccm CO and 90 sccm $O_2$ at a low pressure of 15 mTorr in the etch chamber. 400 watts was provided at 27 MHz. FIG. 6A schematically illustrates, as a reference, a cross-sectional view of the porous low-k dielectric features in a dense area 230 (also shown in FIG. 2E) after the conventional stripping process. The damage to the sidewall of the porous low-k dielectric features is measured using a dilute HF bath process. The HF bath removes the damaged portion of the low-k dielectric such that the damage is measured as a recess of the low-k dielectric features. As shown in FIG. 6A, the recess to the sidewall may be measured as a difference in the critical dimension (CD1) of the cap layer 214 and that (CD2) of the low-k dielectric features 212 per side, i.e., (CD1−CD2)/2. Using the conventional $CO/O_2$ stripping process as discussed above, the recess of the sidewall was about 6.7 to 8.5 nm (average 7.6 nm). Similarly, another conventional $O_2$ stripping process resulted in the sidewall recess amount of about 5.5 to 6.2 nm (average 5.85 nm), where the stripping gas of 130 sccm $O_2$ was used at a low pressure of 10 mTorr with 200 watts at 60 MHz and 200 watts at 27 MHz.

Figure 6B:
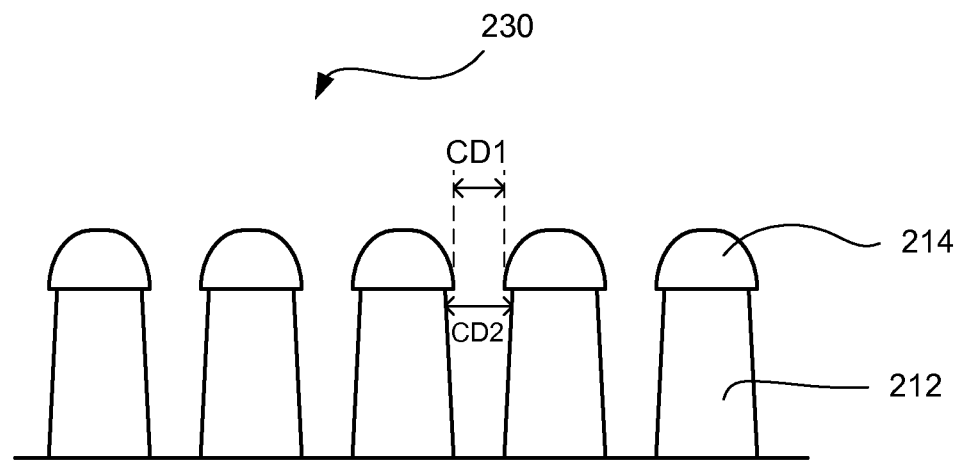
FIG. 6B is a schematic cross-sectional view of features of the porous low-k dielectric layer in a dense area after the stripping process in accordance with one embodiment of the present invention.

FIG. 6B schematically illustrates a cross-sectional view of the low-k dielectric features in a dense area 230 after the stripping process in accordance with one embodiment of the present invention. In one example, COS is added to a conventional $CO/O_2$ gas, and a stripping gas of 9 sccm COS, 40 sccm CO, and 82 sccm $O_2$ is provided at a low pressure of 15 mTorr in the etch chamber. 400 watts was provided at 27 MHz. The measured damage to the side wall was about 4.2 to 4.6 nm (average: 4.4 nm). In another example, a stripping gas of 15 sccm COS, 40 sccm CO, and 75 sccm $O_2$ is provided at a low pressure of 15 mTorr in the etch chamber. 400 watts was provided at 27 MHz. The measured damage to the side wall was about 4.9 to 5.1 nm (average: 5 nm). In yet another example, COS is added to a conventional $O_2$ gas, and a stripping gas of 10 sccm COS and 100 sccm $O_2$ is provided at a low pressure of 10 mTorr in the etch chamber. 200 watts at 60 MHz and 200 watts at 27 MHz were provided. The measured damage to the side wall was about 2.8 to 2.9 nm (average: 2.85 nm). In either case, more improvement was observed at the edge portion of the wafer.

Thus, in accordance with embodiments of the present invention, compared with the conventional $CO/O_2$ stripping, about 40% damage reduction was achieved by adding COS. Similarly, compared with the conventional $O_2$ stripping, the damage was about 50% reduced by adding COS.

The foregoing example is representative of one embodiment of the invention, in which the strip process is performed using an etch configuration, such that the wafer is directly exposed to the influence of the plasma, including charged particles. In some cases a bias RF power would be applied to the wafer. Without being bound by theory, it is believed that this bias power increases the ion bombardment energy and therefore increases the photoresist removal rate and the efficiency of residue removal. Process conditions are defined as follows for this embodiment of the invention.

It is preferable that the stripping gas comprises COS such that the flow ratio of COS is about 1 to 50% of the total flow. More preferably, the flow ratio of COS is about 2 to 25% of the total flow, and further preferably, the flow ratio of COS is about 5 to 15% of the total flow. Alternatively, the ratio of $O_2$ and COS may be about 5:1 to 20:1, preferably, 8:1 to 15:1, and more preferably, about 13:1.

Examples of stripping gas mixtures comprising COS may be combinations of $COS+O_2$, $COS+O_2+CO_2$, $COS+O_2+CO$, $COS+O_2+N_2$, $COS+O_2+N_2+CO$, $COS+CO_2$, $COS+N_2$, $COS+H_2$, $COS+N_2O$, or the like. Various inert gases may also be added in combination with these mixtures.

It is preferable that the inventive stripping process be performed with a chamber pressure of between 1 and 40 mTorr. It is more preferable that the inventive stripping process be performed with a chamber pressure between 1 and 30 mTorr. It is most preferable that the inventive stripping process be performed with a chamber pressure between 5 and 20 mTorr.

It is preferable that the inventive stripping process be performed with an input power of between 10 and 2000 Watts for each power source. It is more preferable that the inventive stripping process be performed with an input power between 50 and 1200 Watts. It is most preferable that the inventive stripping process be performed with an input power between 100 and 1000 Watts.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications and various substitute equivalents as fall within the true spirit and scope of the present invention.

What is claimed is:

1. A method of forming features in a porous low-k dielectric layer disposed below a patterned organic resist mask made of a resist material, comprising:
   (a) etching features into the porous low-k dielectric layer through the patterned organic resist mask; and
   (b) stripping the patterned organic resist mask, comprising:
      providing a stripping gas comprising COS;
      forming a plasma from the stripping gas; and
      stopping the stripping gas,
   wherein a flow ratio of COS is about 5 to 15% of the total flow of the stripping gas.

2. The method as recited in claim 1, wherein a cap layer is provided between the porous low-k dielectric layer and the patterned organic resist mask, and wherein the stripping of the patterned organic resist mask leaves the cap layer on the porous low-k dielectric layer.

3. The method as recited in claim 1, further comprising, prior to the etching of features into the porous low-k dielectric layer:
   depositing the porous low-k dielectric layer on a substrate;
   providing a first patterned photoresist (PR) mask on the porous low-k dielectric layer;
   patterning the porous low-k dielectric layer through the first patterned PR mask;
   providing an organic planarization layer on the patterned porous low-k dielectric layer; and
   etching the organic planarization layer using a second patterned PR mask into the patterned organic resist mask.

4. The method as recited in claim 3, further comprising:
   forming a cap layer on the porous low-k dielectric layer before providing the first patterned PR mask, the cap layer being patterned using the first patterned PR mask in the step of patterning the porous low-k dielectric layer,
   wherein the stripping of the patterned organic resist mask leaves the cap layer on the porous low-k dielectric layer.

5. The method as recited in claim 3, further comprising, after providing the organic planarization layer:
   depositing an oxide layer on the organic planarization layer;
   depositing an antireflective coating (ARC) layer on the oxide layer;
   providing the second patterned PR mask on the ARC layer; and
   opening the ARC layer and the oxide layer through the second patterned PR mask, wherein the organic planarization layer is etched through the second patterned PR mask, the opened ARC layer, and the opened oxide layer.

6. The method as recited in claim 1, wherein the stripping gas further comprises at least one of: $O_2$, $N_2$, $H_2$, $CO_2$, or $N_2O$.

7. The method as recited in claim 1, wherein the stripping gas further comprises $O_2$.

8. The method as recited in claim 7, wherein the stripping gas further comprises CO or $N_2$.

9. The method as recited in claim 1, wherein the stripping gas consists essentially of $O_2$ and COS.

10. A method of forming features in a porous low-k dielectric layer disposed below a patterned organic resist mask made of a resist material, comprising:
    (a) etching features into the porous low-k dielectric layer through the patterned organic resist mask; and
    (b) stripping the patterned organic resist mask, comprising:
       providing a stripping gas comprising COS and $O_2$;
       forming a plasma from the stripping gas; and
       stopping the stripping gas,
    wherein a flow ratio of $O_2$ and COS is about 5:1 to 15:1.

11. The method as recited in claim 10, wherein a flow ratio of $O_2$ and COS is about 8:1 to 15:1.

12. The method as recited in claim 11, wherein a flow ratio of $O_2$ and COS is about 13:1.

13. The method as recited in claim 1, wherein the stripping gas removes the organic resist mask while reducing damages to the low-k dielectric layer having the etched features.

14. The method as recited in claim 7, wherein a flow ratio of $O_2$ and COS is about 5:1 to 15:1.

15. The method as recited in claim 14, wherein a flow ratio of $O_2$ and COS is about 8:1 to 15:1.

16. The method as recited in claim 15, wherein a ratio flow ratio of $O_2$ and COS is about 13:1.

17. The method as recited in claim 1, wherein the stripping gas comprising COS improves reduction of damages to the low-k dielectric layer having the etched features, compared with reduction of damages using a stripping gas lacking COS and comprising CO, $CO_2$, $N_2$, or $N_2O$ in place of COS.

18. The method as recited in claim 10, wherein the stripping gas comprising COS improves reduction of damages to the low-k dielectric layer having the etched features, compared with reduction of damages using a stripping gas lacking COS and comprising CO, $CO_2$, $N_2$, or $N_2O$ in place of COS.

19. The method as recited in claim 1, wherein the stripping is performed with a chamber pressure between 5 and 20 mTorr.

20. The method as recited in claim 10, wherein the stripping is performed with a chamber pressure of between 5 and 20 mTorr.

* * * * *